United States Patent

Krieg

[11] Patent Number: 5,886,524
[45] Date of Patent: Mar. 23, 1999

[54] METHOD OF DISTORTION CORRECTION FOR GRADIENT NON-LINEARITIES IN NUCLEAR MAGNETIC RESONANCE TOMOGRAPHY APPARATUS

[75] Inventor: Robert Krieg, Nuremburg, Germany

[73] Assignee: Siemens Aktiengesellschaft, Munich, Germany

[21] Appl. No.: 741,389

[22] Filed: Oct. 29, 1996

[30] Foreign Application Priority Data

Oct. 30, 1995 [DE] Germany ............... 195 40 837.3

[51] Int. Cl.$^6$ ............................................. G01V 3/00
[52] U.S. Cl. .................................... 324/312; 324/307
[58] Field of Search .................... 324/300, 307, 324/309, 312; 382/128, 255, 256, 274, 277

[56] References Cited

U.S. PATENT DOCUMENTS

| | | | |
|---|---|---|---|
| 4,385,301 | 5/1983 | Tricoles et al. | 343/113 R |
| 4,706,025 | 11/1987 | Edelstein et al. | |
| 4,876,509 | 10/1989 | Perlmutter | 324/309 |
| 4,991,092 | 2/1991 | Greensite | 364/413.13 |
| 5,208,872 | 5/1993 | Fisher | 382/42 |
| 5,642,047 | 6/1997 | Bernstein | 324/309 |

FOREIGN PATENT DOCUMENTS

OS 44 16 363  11/1995  Germany.

OTHER PUBLICATIONS

"Estimation of Static Magnetic Field and Gradient Fields from NMR Image," Kawanaka et al., J. Phys. E: Sci. Instrum., vol. 19, (1986) pp. 871–875.

"Simulation of the Influence of Magnetic Field Inhomogeneity and Distortion Correction in MR Imaging," Weis et al., Magnetic Resonance Imaging, vol. 8, (1990) pp. 483–489.

"Reconstructing NMR Images Under Magnetic Fields with Large Inhomogeneities," Lai, J. Phys. E: Sci. Instrum., vol. 15, (1982) pp. 1093–1100.

Primary Examiner—Louis M. Arana
Attorney, Agent, or Firm—Hill & Simpson

[57] ABSTRACT

In a method of distortion correction for gradient non-linearities in a nuclear magnetic resonance tomography apparatus, two auxiliary datasets $h(x,)$, $f(x,y)$ are measured that describe the shift of a measured location $(x',y')$ relative to an actual location $(x,y)$ of a signal origin. A corrected auxiliary dataset $h(x+f(x,y), y)$ is produced from the auxiliary dataset $h(x,y)$. A location correction in y-direction ensues in an image dataset upon employment of the corrected auxiliary dataset $h(x+f(x,y), y)$. A first intensity correction also ensues. A location correction in x-direction subsequently ensues with a second intensity correction. Alternatively, the location correction can also ensue by Fresnel transformation of the raw dataset upon involvement of the corrected auxiliary data $h(x+f(x,y), y)$.

13 Claims, 6 Drawing Sheets

METHOD OF DISTORTION CORRECTION FOR GRADIENT NON-LINEARITIES IN NUCLEAR MAGNETIC RESONANCE TOMOGRAPHY APPARATUS

BACKGROUND OF THE INVENTION

1. Field of the Invention

The present invention is directed to a method of distortion correction for gradient non-linearities in nuclear magnetic resonance tomography apparatus.

2. Description of the Prior Art

As is known, inhomogeneities in the basic magnetic field and non-linearities of gradient fields lead to image distortions if there are no corrective or preventative measures in the standard MR imaging sequences. Pulse sequences currently utilized are generally based on a technique referred to as the "Spin Warp" method as disclosed, for example, in U.S. Pat. No. 4,706,025. Each nuclear magnetic resonance signal is thereby phase-encoded in at least one direction before the readout and is frequency-encoded in another direction by a readout gradient during readout. A number of differently phase-encoded nuclear magnetic resonance signals are acquired. The nuclear magnetic resonance signals are sampled, digitized onto a grid in the k-space and entered into a raw data matrix in the k-space. A Fourier transformation in the phase-encoding direction as well as in the frequency-encoding direction is implemented in the raw data matrix for image acquisition.

A number of correction methods have been described in the literature wherein image distortions due to non-uniform magnetic fields are corrected by an after-processing (post-processing) of the raw data or of the calculated image data, for example, the article by J. Weis, L. Budinski, "Simulation of the Influence of Magnetic Field Inhomogeneity and Distortion Correction in MR Imaging" in Magnetic Resonance Imaging, Vol. 8, pp. 483–489, 1990. It is known from this reference to correct image distortions by after-processing of an image acquired in a conventional way (i.e. with at least two-dimensional Fourier transformation). The information about the magnetic field inhomogeneities that is thereby required, i.e. about the course of the basic magnetic field, is thereby acquired from the phase of separately registered spin echo images.

It is known from the article by C. -M. Lai, "Reconstructing NMR Images under Magnetic Fields with Large Inhomogeneities", in J. Phys. E: Sci. Instrum., Vol.15, 1982, pp.1093–1100, to involve inhomogeneities in the image reconstruction. This work is based on a technique that is no longer a standard projection reconstruction, whereby the known projection reconstruction algorithm is replaced by an algorithm wherein the previously identified magnetic field inhomogeneity is already taken into consideration in the image reconstruction.

If only inhomogeneities of the basic magnetic field are taken into consideration, these are relatively uncritical in the phase-encoding direction since the only concern is signal differences between the individual phase-encoding steps. In the direction of the readout gradient, however, the superimposition of the readout gradient with basic field inhomogeneities leads to distortions. In a method according to German OS 44 16 363, a conventional Fourier transformation is therefore implemented in the phase-encoding direction, whereas a generalized Fresnel transformation (wherein a previously identified location dependency of the basic magnetic field in readout direction is taken into account) is implemented in the readout direction.

If not only inhomogeneities of the basic magnetic field, but also non-linearities of the phase-encoding gradient are to be taken into consideration, then a correction must also be implemented in the phase-encoding direction. The outlay for the gradient coils can be reduced when a non-linear field course of the phase-encoding gradient is allowed in the examination field. A strong inducement to utilize non-linear gradients, or even a necessity to do so, exists in the case of the echo planar imaging (EPI) method. As is known, high-amplitude gradients must be switched extremely fast in EPI. This can lead to undesirable physiological stimulations of the patient, even pain in the extreme case. The problem is most serious at the edge of or at the outside the examination field since the largest gradient field swing occurs at those regions. This problem can thus be solved by causing the gradients to flatten toward the edge of the examination field, i.e., they are non-linear.

SUMMARY OF THE INVENTION

An object of the present invention is to correct the distortions associated with gradient non-linearities.

The above object is achieved in accordance with the principles of the present invention in a method for distortion correction for gradient non-linearities in a nuclear magnetic resonance tomography apparatus, wherein two auxiliary datasets $h(x,y)$, $f(x,y)$ are determined which describe a shift of a measured location $(x', y')$ compared to an actual location $(x,y)$ of a signal according to the relationships $y'=y+h(x,y)$ and $x'=x+f(x,y)$. A corrected auxiliary dataset $h(x+f(x,y), y)$ is produced. A raw dataset is measured from an examination subject, and an image dataset is acquired from the raw dataset by two-dimensional Fourier transformation. The image dataset is location corrected in the y-direction using the corrected auxiliary dataset $h(x+f(x,y), y)$. A first intensity correction is conducted on the image dataset. The image dataset is location corrected in the x-direction using the auxiliary dataset $f(x,y)$. A second intensity correction is then conducted on the image dataset.

Alternatively, the location correction of the image dataset in the x-direction can be conducted using the auxiliary dataset $h(x,y)$.

Another alternative is to acquire the image dataset from the raw dataset using a Fresnel transformation, taking the corrected auxiliary dataset $h(x+f(x,y), y)$ into consideration.

DESCRIPTION OF THE PREFERRED EMBODIMENTS

Figure 1:
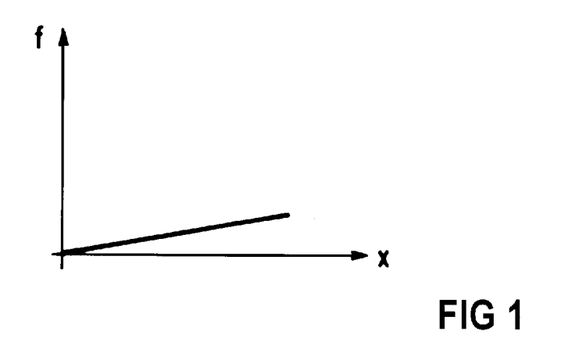
FIG. 1 illustrates the course of a linear gradient in the x-direction in a magnetic resonance imaging apparatus.
Figure 2:
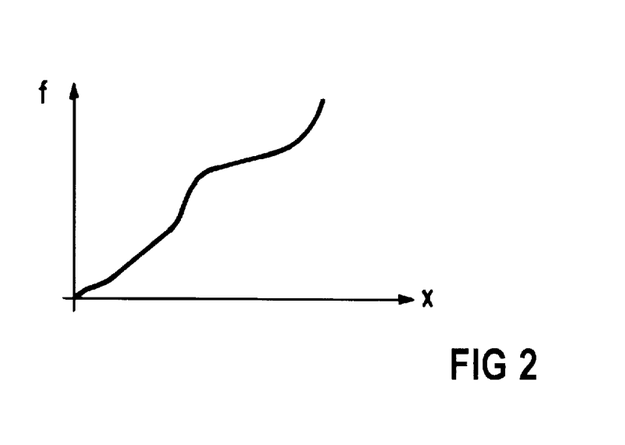
FIG. 2 illustrates the course of a non-linear gradient in the x-direction in a magnetic resonance imaging apparatus.

FIGS. 1 and 2 respectively schematically show the field course for a linear and non-linear gradient in the x-direction. In the linear case, the fields $G_x(x,y)$ and $G_y(x,y)$ of the gradient coils respectively for the x-direction and the y-direction (not shown) are as follows:

$$G_x(x,y) = x \cdot g_x \qquad (1)$$

$$G_y(x,y) = y \cdot g_y \qquad (2)$$

For the non-linear case, a location-dependent field quantity is also added thereto, this being respectively referenced f'(x,y) and h'(x,y) below.

$$G_x(x,y) = x \cdot g_x + f'(x,y) \qquad (3)$$

$$G_y(x,y) = y \cdot g_y + h'(x,y) \qquad (4)$$

The non-linearity causes a shift in the location, which can be specifically illustrated by a different notation of Equations 3 and 4:

$$g_x(x+(f'(x,y))/g_x) = g_x(x+f(x,y)) = g_x x' \qquad (5)$$

$$g_y(y+(h'(x,y))/g_y) = g_y(y+h(x,y)) = g_y y' \qquad (6)$$

A location shift is thus caused due to the non-linearity. A picture element that would have come to lie at the location x,y under linear gradients is thus imaged at x',y' under non-linear gradients, whereby the shift is established by the functions f(x,y), h(x,y).

Figure 3:
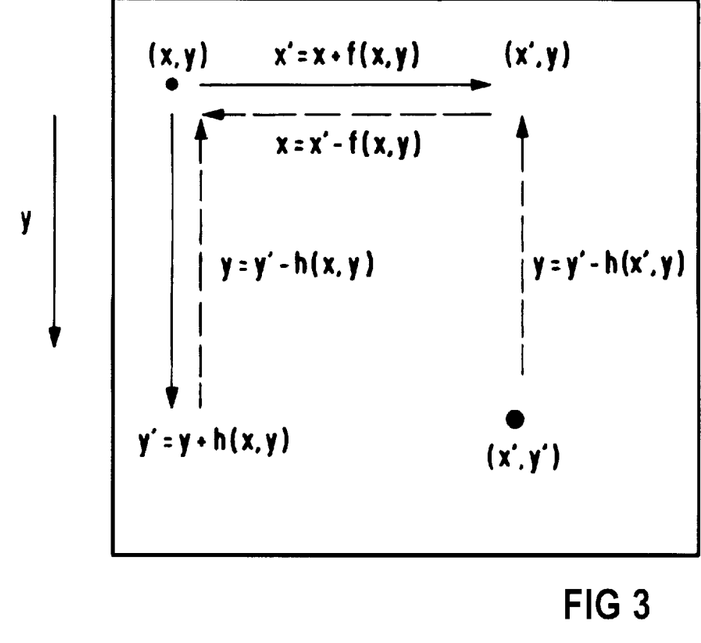
FIG. 3 shows the location shift of a pixel due to gradient non-linearities.

FIG. 3 schematically shows the shift of the locus coordinate x,y onto the locus coordinate x',y'.

The functions f(x,y) and h(x,y) can be determined when the actual field course is known with sufficient precision. First, the actual magnetic field course must be measured under the respective gradient. There are a number of different methods for this such as described, for example, in German OS 42 18 902 or by A. A. Maudsley et al., Siemens Forschungs- und Entwicklungsberichte, Vol.8 (1979), No.6, Springer Verlag 1979, "Rapid Measurement of Magnetic Field Distributions Using Nuclear Magnetic Resonance." Since conventional methods for magnetic field measurement can be used for the subject matter of the invention, these need not be explained in detail herein.

For reconstruction of each and every pixel x,y, thus, the pixel x',y' to which the location shift occurred must first be found. This would be possible without further difficulty on the basis of Equations 5 and 6:

$$y' = y + h(x,y) \qquad (7)$$

$$x' = x + f(x,y) \qquad (8)$$

Figure 4:
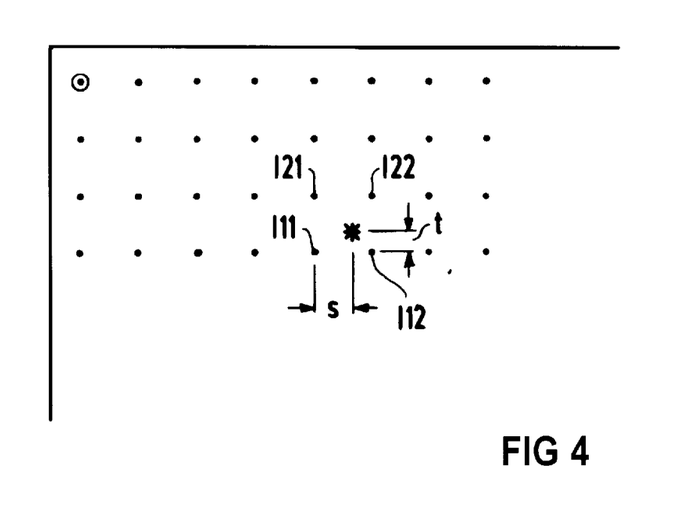
FIG. 4 shows the schematic position of a shifted point in the digital grid.

In a first approximation, thus, the intensity I for the pixel x,y would be replaced by the intensity at the location x',y'. Two circumstances, however, must be taken into consideration:

First, the point x',y' generally will not lie on the measured grid points. The sought intensity I would therefore be determined by interpolation of the intensities I11, I12, I21, I22 of surrounding grid points according to FIG. 4. This, for example, can ensue by bilinear interpolation according to the following equation:

$$I(x',y') = s \cdot t \cdot I_{11} + (1-s)tI_{12} + (1-t)sI_{21} + (1-t)(1-s)I_{22} \qquad (9)$$

wherein s is the spacing of the point x'y' from the grid point 11 in the x-direction in the unit grid, and t is the corresponding distance from the grid point 12. Even more neighboring points could be involved, however, and, for example, a known bicubic interpolation could be implemented.

Further, however, it must also be taken into account that the distortion causes not only a location shift but also a change in the size of the pixel. The intensity I(x',y') must therefore also be multiplied by a corresponding correction factor. For example, the known Jacobi determinant J can be utilized as a correction factor, this being a measure for the change in size of the pixel:

$$J = \left(1 + \frac{df(x,y)}{dx}\right)\left(1 + \frac{dh(x,y)}{dy}\right) \qquad (10)$$

This method, however, leads to unsatisfactory results, especially given more pronounced inhomogeneities. Significant smearing occurs particularly at the edges of the observation window. It has been recognized that this is due to the incompleteness of the above-presented correction, as explained below with reference to FIG. 5.

Figure 5:
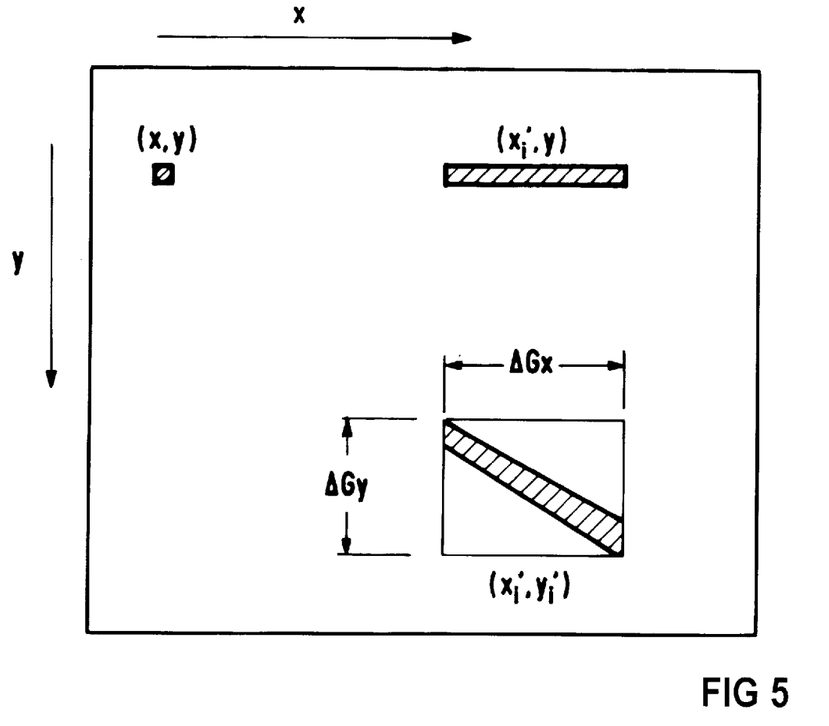
FIG. 5 shows the smearing of a point due to gradient non-linearities.
Figure 6:
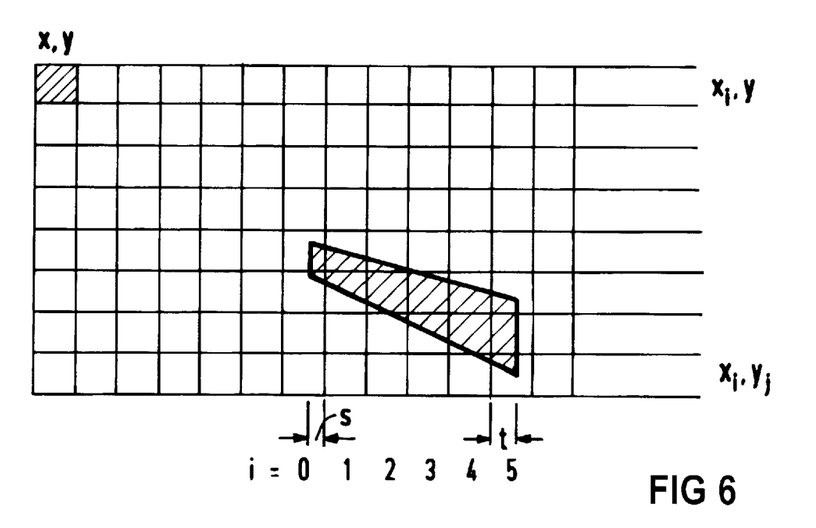
FIG. 6 shows a smeared pixel in a digital grid.

As shown in FIG. 5, a smearing of the pixel x,y in the diagonal direction ensues in the present example due to the gradient non-linearities, i.e. the shifted pixel x',y' has the form of a diagonal bar shown black in FIG. 5. The original pixel x,y is thus expanded onto a number of pixels in the distorted image. In the aforementioned correction, one proceeds on the basis of a spread of the pixel onto the region Δgx, Δgy, i.e. the entire rectangle shown shaded is imaged into the pixel x,y. This leads to the above-presented inadequacies of the reconstruction.

This can be avoided with the method of the invention presented below.

In a first exemplary embodiment, the pixel x,y is not immediately calculated; rather, the pixel x',y is first calculated in a first step. The pixel x',y' belonging to this pixel is thus sought according to the following equation:

$$y' = y + h(x',y) = y + h(x+f(x,y), y) \qquad (11)$$

The value h(x',y) therefore should not be used for the reconstruction of (x',y); rather, the value h(x,y) must be selected. Since, however, x is not yet known (the aim, of course, is to reconstruct the pixel x',y'), it must be determined by the relationship:

$$x' = f(x,y) + x.$$

The function h(x,y) is thus replaced by the function $\bar{h} = h(x - f(x,y), y)$.

As already stated above, a field measurement and the determination of the functions f(x,y) and h(x,y) therefrom are required for a correction. In practice, these functions are stored in the form of a matrix that is referred to below as auxiliary data matrix F or H. For the aforementioned exemplary embodiment of the invention, however, it is not the function h(x,y) but the function h(x+f(xy),y) that is required. The conversion of this function corresponds to a correction of the matrix H in the x-direction, i.e., a row correction in the conventional nomenclature.

In this method, too, the intensity must of course be determined by interpolation. Further, an intensity correction is required that, for example, can again ensue with the Jacobi factor. In the column direction, however, the corrected function $\bar{h}(x,y)$ is now applied, i.e. the corrected matrix H. In the column direction, the Jacobi determinant $J_{sp}$ is thus derived as:

$$J_{sp} + \frac{d\bar{h}(x,y)}{dy}$$

In the row direction, the Jacobi determinant $J_z$ remains:

$$J_z = 1 + \frac{df(x,y)}{dx}$$

A more exact intensity determination than that achieved with the Jacobi determinant, however, is obtained when, according to a method of Weis and Budinski (J. Weis, L. Budinski, "Simulation of the Influence of Magnetic Field Inhomogeneity and Distortion Correction in MR Imaging", Magnetic Resonance Imaging, Vol.8, pp. 483–489, 1990), the intensity is summed over the actual region of the enlarged pixel and the quantity obtained in this way is utilized as the intensity value. A unit grid (grid constant=1) always forms the basis in the following considerations.

First, a column correction, i.e. a correction in the y-direction, is thereby implemented as follows. First, the upper limit $y_o$ and the lower limit $_uy$ for the elongated pixel is determined for each column I as follows:

$$y'_o = y+0.5+h(x_i+f(x,y), y+0.5)$$

$$y'_u = y-0.5+h(x_i+f(x,y), y-0.5)$$

The intensity $I(x_i, y)$ then derives as follows:

$$I(x_i, y) \triangleq I(x_i, y') = \sum_{j=y'_u}^{y'_o} I(x_i, y_j) \cdot w_{ij}$$

wherein $w_{ij}$ is a weighting factor. The weighting factor $w_{ij}$ indicates the part of a specific pixel i,j that lies within the region $y'_u$ through $y'_o$. Pixels lying fully in this region are weighted with the weighting factor 1; pixels lying only partly in this region are correspondingly proportionately weighted.

It is important that the corrected function h(x+f(x,y),y) rather than the function h(x,y) that is used in the determination of the limits or boundaries, this being obtained from the aforementioned auxiliary data matrix.

As a result of the column correction, i.e. the aforementioned shift and intensity correction, one obtains a temporary intermediate image that is now only corrected in the row direction. As set forth below, this likewise ensues according to the method of Weis/Budinski.

First, the limits or boundaries of the elongated pixel are determined in the x-direction:

$$x'_o = x+0.5+f(x+0.5, y)$$

$$x'_u = x-0.5+f(x-0.5, y)$$

wherein $x'_o$ is the upper limit of the region and $x'_u$ the lower limit. The value $f(x+0.5,y)$ is acquired from $(f(x+1,y)+f(x,y))/2$.

The sought intensity $I(x,y)$ of the pixel x,y to be reconstructed is then derived by weighted addition of all pixels of the region between $x_o$ and $x_u$:

$$I(x_i, y) \triangleq I(x', y') = \sum_{x'_u}^{x'_o} I(x_{iy}) \cdot w_i$$

wherein $w_i$ is the weighting factor that corresponds to the part of the pixel $x_i$ that lies within the region $x'_o$ through $x'_u$. When, for example, the pixels are continuously numbered from 0 through 5 according to FIG. 5 and the edge regions are referenced s at the lower limit and t at the upper limit, then the following weighting factors $w_i$ derive:

$$w_i=1 \text{ for } \in[1,4], w_0=s, w_5=t.$$

Since the functions h and f are likewise present in a fixed grid, interpolation must, of course, likewise be carried out in the calculation of the function h(x+f(x,y), y).

It must be pointed out that the sequence in the disclosed method can, of course, also be reversed, i.e. a row correction can be implemented first followed by a column correction.

In the method that was implemented up to now, the correction was implemented in the image data matrix, i.e. after the two-dimensional Fourier transformation of the raw data matrix. In an alternative embodiment of the invention, however, the correction can also be incorporated in the back-transformation of the raw data into image data. A modification of the Fresnel transformation disclosed in the above-cited, German OS 44 16 363 can be employed. The point of departure is a raw data matrix in the k-space that contains the measured signals $S(k_x, k_y)$. The k-values are defined in a known way as follows:

$$k_x(t) = \gamma \cdot \int_0^t G_R(t')dt'$$

$$k_y(t) = \gamma \cdot \int_0^t G_P(t')dt'$$

wherein
 $\gamma$=gyromagnetic ratio
 $G_R(t')$=momentary value of the readout gradient
 $G_P(t')$=momentary value of the phase-encoding gradient.

Image data $\tilde{s}(x_m, y_n)$ are then acquired from the raw data $S(k_x, k_y)$ according to the following equation:

$$\tilde{S}(x_m,y_n) = \int J(x_m,y_n) S(x_m,y_n) dxdy \{e^{ik_x(x-x_m+f(x,y)-f(x_m,y_n))} dk_x * e^{ik_y y - y_m + h(x+f(x,y),y)-h(x+f(x,y^{n),y_n})}dk_y$$

wherein the subscript m indicates the column number, and the subscript n indicates the row number of the image data matrix. The intensity correction factor $J(x_m, y_n)$ is thereby equal to the Jacobi determinant according to Equation 10, however, it is important that it is not the function h(x,y) but the corrected function h(x+f(x,y), y) that is applied. The functions h and f thereby take the gradient non-linearities into account in the calculation of the image data matrix from the raw data matrix.

Figure 7:
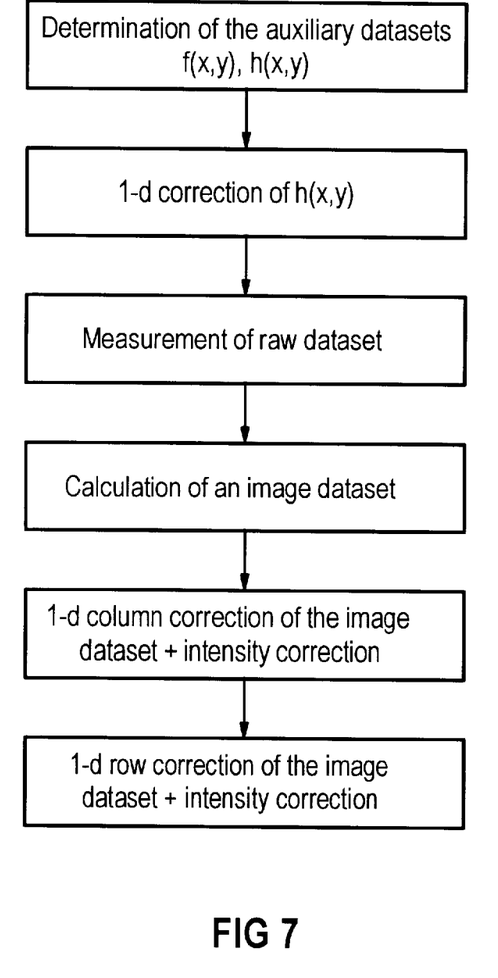
FIG. 7 shows a flowchart with correction of the image dataset.

The disclosed method for distortion correction in the image data domain is summarized in FIG. 7 in the form of a flowchart. First, the magnetic field course under the non-linear gradient is measured for the system, and auxiliary datasets f(x,y) and h(x,y) are determined therefrom in the form of matrices. The corrected auxiliary datasets $\bar{h}(x,y)$ are determined according to the relationship h(x+f(x,y), y).

For determining the actual measured data, a raw dataset is first produced according to conventional methods, and an image dataset is calculated therefrom by two-dimensional Fourier transformation. A one-dimensional column correction with the disclosed intensity correction first ensues in this image dataset. A one-dimensional row correction of the image dataset is subsequently implemented.

Figure 8:
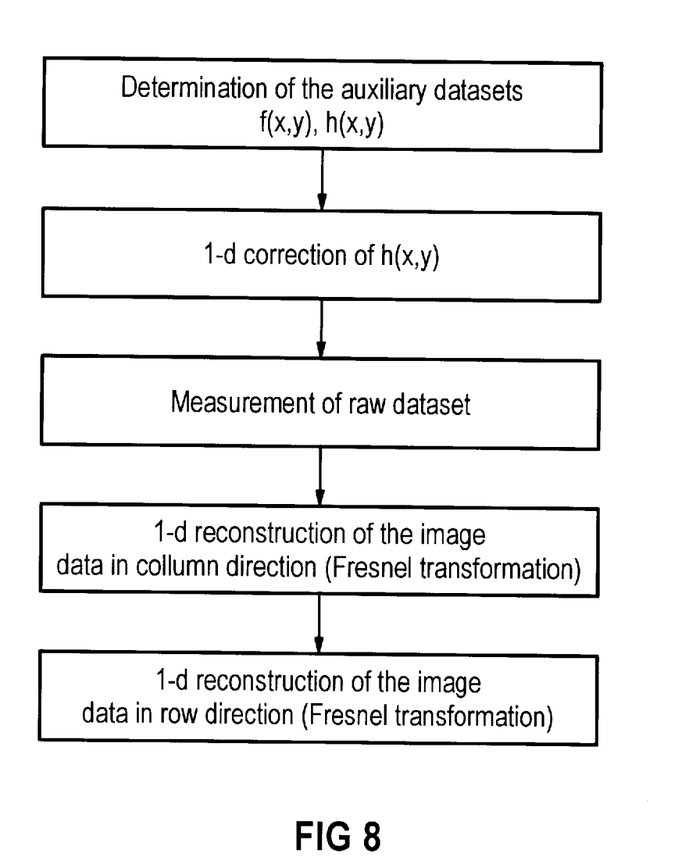
FIG. 8 shows a flowchart with correction in the image reconstruction from the raw data.

The correction method in the reconstruction of the image data matrix is summarized in FIG. 8 in the form of a flowchart. First, the functions f(x,y) and h(x,y) are determined by measuring the magnetic field course with activated gradients. The function h(x+f(x,y), y) is acquired by correction of the auxiliary dataset h(x,y). For image acquisition, a raw dataset is first measured as in conventional methods. An image data matrix wherein the distortions are corrected is produced therefrom by two-dimensional Fresnel transformation, taking the auxiliary dataset f and the corrected auxiliary dataset h into consideration.

Figure 9:
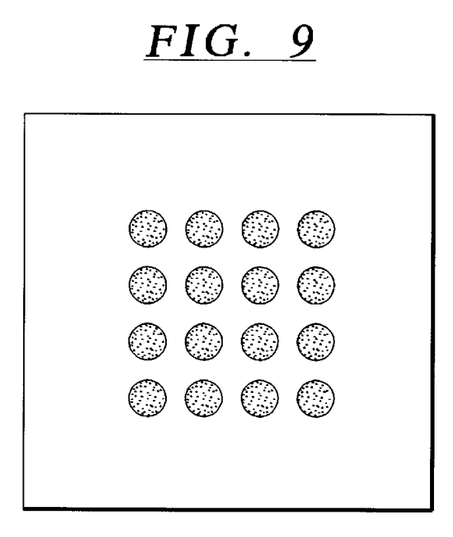
FIG. 9 shows an undistorted image of a grid.
Figure 10:
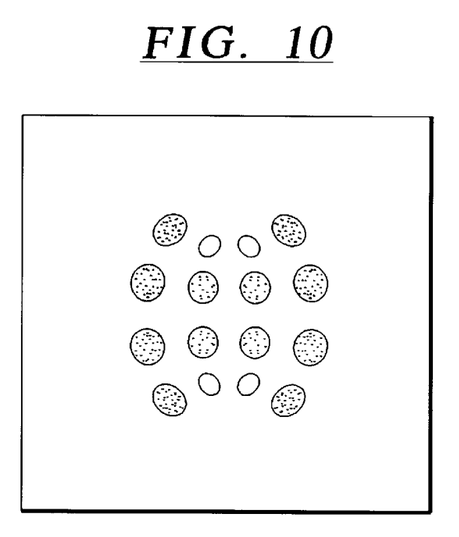
FIG. 10 shows a distorted image of a grid without correction.
Figure 11:
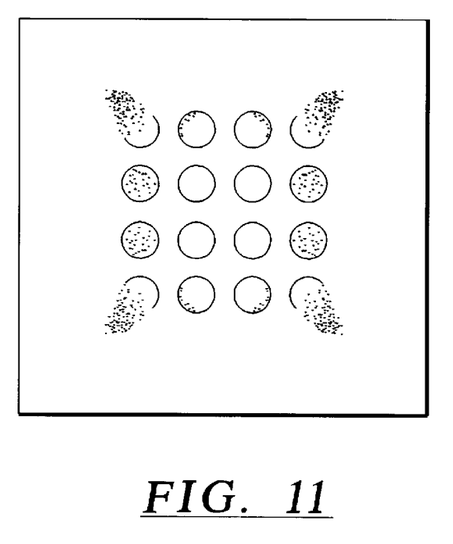
FIG. 11 shows an image of a grid with correction according to the prior art.
Figure 12:
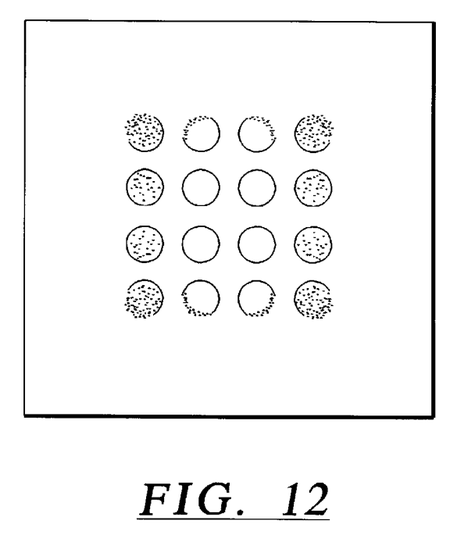
FIG. 12 shows an image of a grid with a correction according to the invention.

Various images of specimens are shown in a uniform grid in FIGS. 9 through 12 for illustrating the advantages of the invention. FIG. 9 shows the imaging of the specimens in a uniform basic field with linear readout gradients. FIG. 10 shows an image acquired given non-linear readout gradients without correction measures. FIG. 11 shows an image acquired given non-linear readout gradients when the reconstruction is implemented with the uncorrected function h(x,y). FIG. 12, finally, shows an image acquired with the inventive correction method given non-linear readout gradients.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for distortion correction for gradient non-linearities in a nuclear magnetic resonance tomography apparatus, comprising the steps:

determining two auxiliary datasets h(x,y), f(x,y) that describe a shift of a measured location (x',y') compared to an actual location (x,y) of a signal origin according to the relationships $$y'=y+h(x,y)$$

$$x'=x+f(x,y);$$

producing a corrected auxiliary dataset h(x+f(x,y), y);
measuring a raw dataset from an examination subject;
acquiring an image dataset from the raw dataset by two-dimensional Fourier transformation;
location correcting of the image dataset in the y-direction using the corrected auxiliary dataset h(x+f(x,y), y);
conducting a first intensity correction of the image dataset;
location correcting the image dataset in x-direction using the auxiliary dataset f(x,y); and
conducting a second intensity correction of the image dataset.

2. A method according to claim 1, wherein the intensity correction is conducted with the following steps:

determining the intensity at the actual location (x,y) by interpolation from the grid points of the image data matrix that surround the point (x',y');

multiplying the intensity value by a Jacobi determinant $$\left(1+\frac{df(x,y)}{dx}\right)$$

in the x-direction and by a Jacobi determinant $$\left(1+\frac{dh(x+f(x,y),y)}{dy}\right)$$

in the y-direction.

3. A method according to claim 1, wherein the intensity of the image pixel at the actual location (x,y) is determined by weighted summation of the intensities of the pixels in a region around the measured location (x',y'), said the region covering an enlargement of a pixel due to the distortion.

4. A method according to claim 3, further comprising determining an upper limit $(x'_o)$ of the region around the measured location (x',y') in a unit grid by $$x'_o=x+0.5+f(x+0.5, y);$$

and determining a lower limit $(x'_u)$ of the region around the measured location (x',y') in a unit grid by $$x'_u=x-0.5+f(x-0.5, y).$$

5. A method according to claim 4 further comprising determining an upper limit $(y'_o)$ of the region around the measured location (x',y') in a unit grid by $$y'_o=y+0.5+h(x+f(x,y), y+0.5);$$

and determining a lower limit $(y'_u)$ of the region around the measured location (x',y') in a unit grid by $$y'_u=y-0.5+h(x+f(x,y), y-0.5).$$

6. A method for distortion correction for gradient non-linearities in a nuclear magnetic resonance tomography apparatus, comprising the steps of:

determining two auxiliary datasets h(x,y), f(x,y) that describe a shift of a measured location (x',y') compared to an actual location (x,y) of a signal origin according to the relationships $$y'=y+h(x,y)$$

$$x'=x+f(x,y);$$

producing a corrected auxiliary dataset f(x+h(x,y), y);
measuring a raw dataset from an examination subject;
acquiring an image dataset from the raw dataset by two-dimensional Fourier transformation;
location correcting of the image dataset in the y-direction using the corrected auxiliary dataset f(x,y+h(x,y));
conducting an intensity correction of the image dataset;
location correcting the image dataset in x-direction using the auxiliary dataset h(x,y); and
conducting an intensity correction of the image dataset.

7. A method according to claim 6, wherein the intensity correction is conducted with the following steps:

determining the intensity at the actual location (x,y) by interpolation from the grid points of the image data matrix that surround the point (x',y');

multiplying the intensity value by a Jacobi determinant $$\left(1 + \frac{df(x,y)}{dx}\right)$$

in the x-direction and by a Jacobi determinant $$\left(1 + \frac{dh(x+f(x,y),y)}{dy}\right)$$

in the y-direction.

8. A method according to claim 7, wherein the intensity of the image pixel at the actual location (x,y) is determined by weighted summation of the intensities of the pixels in a region around the measured location (x',y'), said the region covering an enlargement of a pixel due to the distortion.

9. A method according to claim 6, further comprising determining an upper limit ($x'_o$) of the region around the measured location (x',y') in a unit grid by $$x'_o = x + 0.5 + f(x+0.5, y);$$

and determining a lower limit ($x'_u$) of the region around the measured location (x',y') in a unit grid by $$x'_u = x - 0.5 + f(x-0.5, y).$$

10. A method according to claim 6 further comprising determining an upper limit ($y'_o$) of the region around the measured location (x',y') in a unit grid by $$y'_o = y + 0.5 + h(x+f(x,y), y+0.5);$$

and determining a lower limit ($y'_u$) of the region around the measured location (x',y') in a unit grid by $$y'_u = y - 0.5 + h(x+f(x,y), y-0.5).$$

11. A method for distortion correction for gradient non-linearities in nuclear magnetic resonance tomography apparatus, comprising the steps of:

determining two auxiliary datasets h(x,y), f(x,y) that describe a shift of a measured location (x',y') compared to an actual location (x,y) of a signal origin according to the relationships $$y' = y + h(x,y)$$

$$x' = x + f(x,y);$$

producing a corrected auxiliary dataset h(x+f(x,y), y);

measuring a raw dataset from an examination subject; and acquiring an image dataset from the raw dataset with a Fresnel transformation, taking the corrected auxiliary dataset h(x+f(x,y), y) into consideration.

12. A method for distortion correction according to claim 11, wherein the image data $\bar{s}(x_m, y_n)$ are acquired from the raw data $S(_m x_n y)$ on the basis of the following relationship:

$$\bar{S}(x_m, y_n) = \int I(x_m, y_n) S(x_m, y_n) dx dy * \int e^{ik_x(x-x_m+f(x,y_n)-f(x_m,y_n))} dk_x *$$

$$\int e^{ik_y y - y_m + h(x+f(x,y),y) - h(x+f(x,y_n),y_n)} dk_y$$

wherein m is a row number of the raw data matrix and of the image data matrix, n is a column number of the raw data matrix and of the image data matrix, $k_x = \int \gamma \cdot g_x dt$ with $g_x$=gradient field strength in the x-direction, whereby $k_y = \int \gamma \cdot g_y dt$ with $g_y$=gradient field strength in the y-direction, and $I(x_m, y_n)$ is an intensity factor.

13. A method according to claim 12, wherein the intensity correction factor $I(x_m, y_n)$ is calculated according to the following relationship:

$$I(x_m, y_n) = \left(1 + \frac{df(x,y)}{dx}\right)\left(1 + \frac{dh(x_m + f(x_m,y), y)}{dy}\right).$$

* * * * *